(12) United States Patent  
Doerr

(10) Patent No.: US 8,883,018 B2  
(45) Date of Patent: Nov. 11, 2014

(54) LOW-LOSS, WIDE-BAND GRATING COUPLER AND METHOD OF MAKING SAME

(71) Applicant: Acacia Communications Inc., Maynard, MA (US)

(72) Inventor: Christopher Doerr, Maynard, MA (US)

(73) Assignee: Acacia Communications Inc., Maynard, MA (US)

( * ) Notice: Subject to any disclaimer, the term of this patent is extended or adjusted under 35 U.S.C. 154(b) by 0 days.

(21) Appl. No.: 13/733,118

(22) Filed: Jan. 2, 2013

(65) Prior Publication Data

US 2013/0233824 A1    Sep. 12, 2013

Related U.S. Application Data

(60) Provisional application No. 61/582,389, filed on Jan. 1, 2012.

(51) Int. Cl.
| | |
|---|---|
| *B29D 11/00* | (2006.01) |
| *G02B 6/00* | (2006.01) |
| *G03F 7/00* | (2006.01) |
| *C03C 15/00* | (2006.01) |

(52) U.S. Cl.  
CPC . *C03C 15/00* (2013.01); *G02B 6/00* (2013.01); *G03F 7/00* (2013.01)  
USPC ......... 216/24; 216/2; 216/7; 216/79; 356/328

(58) Field of Classification Search  
USPC ............................... 216/2, 7, 24, 79; 356/328  
See application file for complete search history.

(56) References Cited

U.S. PATENT DOCUMENTS

| | | | | |
|---|---|---|---|---|
| 5,770,465 | A | * | 6/1998 | MacDonald et al. ............. 216/2 |
| 5,977,604 | A | * | 11/1999 | Babic et al. .................... 257/466 |
| 6,946,238 | B2 | * | 9/2005 | Zhang et al. .................. 430/321 |

* cited by examiner

*Primary Examiner* — Lan Vinh  
*Assistant Examiner* — Maki Angadi  
(74) *Attorney, Agent, or Firm* — Jeffrey J. Brosemer

(57) ABSTRACT

A method for fabricating a grating coupler having a bottom mirror in a semiconductor wafer including etching a trench from a top surface of a wafer and around a grating coupler formed in the wafer; etching a void underneath the grating coupler; etching a via into the void from the backside of the wafer; and depositing a mirror on the bottom of the grating coupler. Alternatively, additional oxide may be deposited on the bottom of the grating coupler prior to the deposition of the mirror such that a desirable oxide thickness on the bottom is achieved.

6 Claims, 7 Drawing Sheets

LOW-LOSS, WIDE-BAND GRATING COUPLER AND METHOD OF MAKING SAME

CROSS REFERENCE TO RELATED APPLICATIONS

This application claims the benefit of U.S. Provisional Patent Application Ser. No. 61/582,389 filed Jan. 1, 2011 which is incorporated by reference in its entirety as if set forth at length herein.

TECHNICAL FIELD

This disclosure relates generally to the field of telecommunications and in particular to a low-loss, wide-band grating coupler and method of making same.

BACKGROUND

Contemporary optical communications and other systems oftentimes employ grating couplers to couple light to/from photonic integrated circuits. Accordingly couplers and methods of making same that improve their optical coupling characteristics would represent a welcome addition to the art.

SUMMARY

An advance in the art is made according to an aspect of the present disclosure directed to techniques and methods for preparing low-loss wide-band grating couplers.

Viewed from a first aspect, the present disclosure is directed to a method for fabricating a grating coupler and in particular to a method for applying a bottom mirror such that the efficiency and bandwidth of the grating coupler is improved.

More specifically, a method according to the present disclosure comprises etching a trench from a top surface of a wafer and around a grating coupler formed in the wafer; etching a void underneath the grating coupler; etching a via into the void from the backside of the wafer; and depositing a mirror on the bottom of the grating coupler. Alternatively, additional oxide may be deposited on the bottom of the grating coupler prior to the deposition of the mirror such that a desirable oxide thickness on the bottom is achieved.

BRIEF DESCRIPTION OF THE DRAWING

A more complete understanding of the present disclosure may be realized by reference to the accompanying drawings in which.

DETAILED DESCRIPTION

Figure 1:
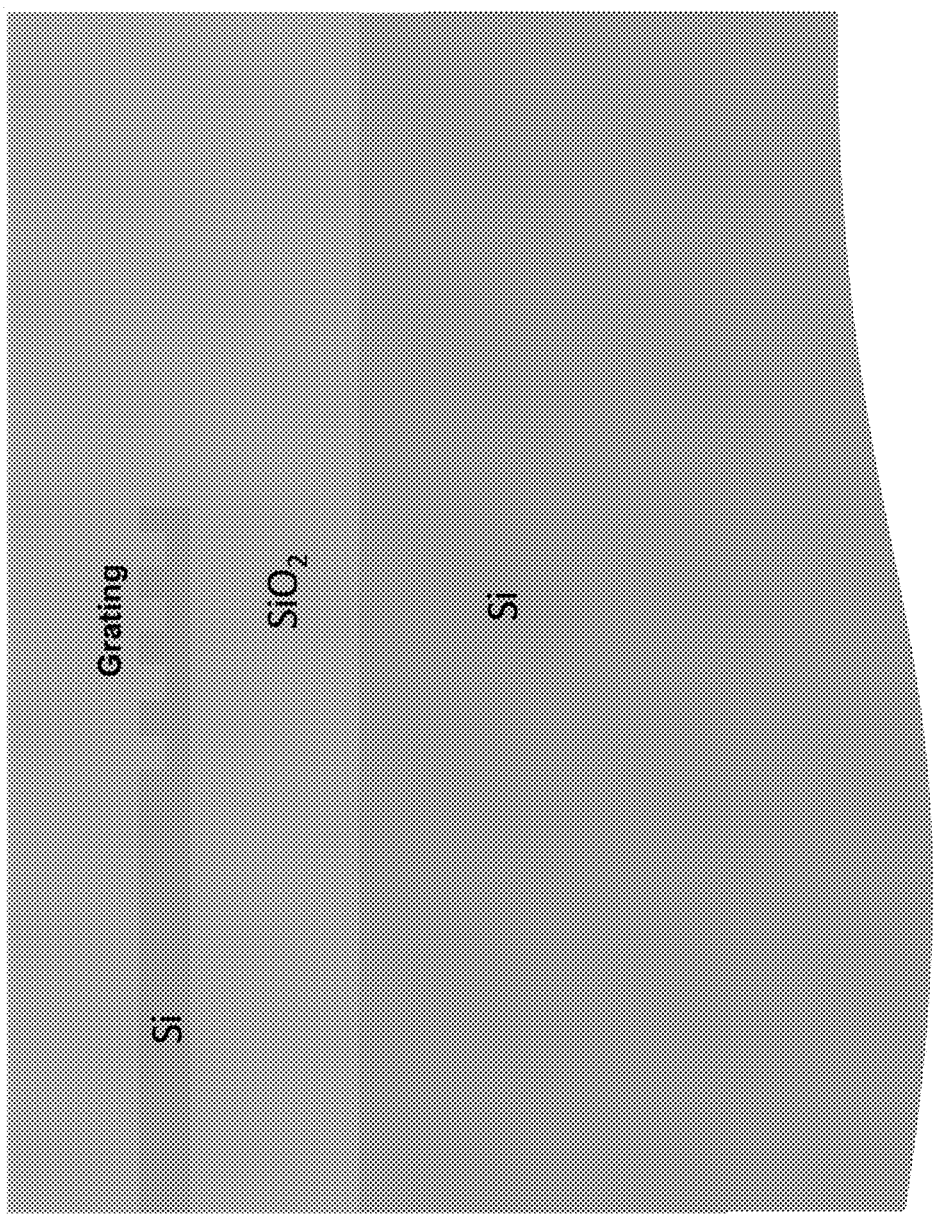
FIG. 1 shows a schematic side view of a completed waveguide with grating coupler according to an aspect of the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

By way of some additional background, it is noted that reflectors (mirrors) positioned underneath a grating coupler may increase the coupling efficiency of the grating coupler by amounts of 2-4 dB and further widen the bandwidth of the coupler by an amount ~30%.

Prior art techniques to deposit or otherwise position bottom mirrors involved the use of a special wafer that already included a Bragg mirror under a waveguide—such as a double-SOI (silicon-on-insulator) wafer, or by first depositing a mirror then depositing a lower cladding and waveguide layer. Such techniques generally require expensive, low-yield wafers and the number of Bragg layers is low thereby resulting in a low reflectivity. Additionally, such special wafers require that foundries recalibrate their processes—typically adding to the cost and time required to fabricate. Finally techniques that require deposited waveguides that are no longer single-crystalline usually exhibit high propagation loss and poor uniformity.

In sharp contrast, techniques according to the present disclosure provide mirror deposition on the oxide under the grating coupler. Advantageously, the mirror may be a metal, a dielectric stack, or other mirror technology. Techniques according to the present disclosure provides access to the backside of the oxide layer with minimal disruption to the remainder of the PIC and may advantageously be performed after a foundry has completed normal wafer processing.

Generally, techniques according to the present disclosure involves etching a trench from a top surface around the grating coupler, doing a wet etch to undercut the silicon under the grating coupler, etching a via from the wafer backside, then depositing the mirror from the backside to the bottom of the grating coupler. All of the particular techniques employed in the overall technique are understood are advantageously do not significant compromise the mechanical integrity of the PIC.

Turning now to FIG. 1, there it shows a side view of a grating coupler as known in the art. More specifically, is shows a silicon waveguide including etched holes thereby forming the grating. Additionally, an oxide layer provides a lower and an upper cladding to the waveguide. The entire waveguide/cladding structure overlies a silicon substrate which during fabrication is part of an overall wafer. As may be appreciated, a typical silicon waveguide thickness is on the order of 220 nm, and a typical cladding thickness is on the order of 2 μm each.

Figure 2:
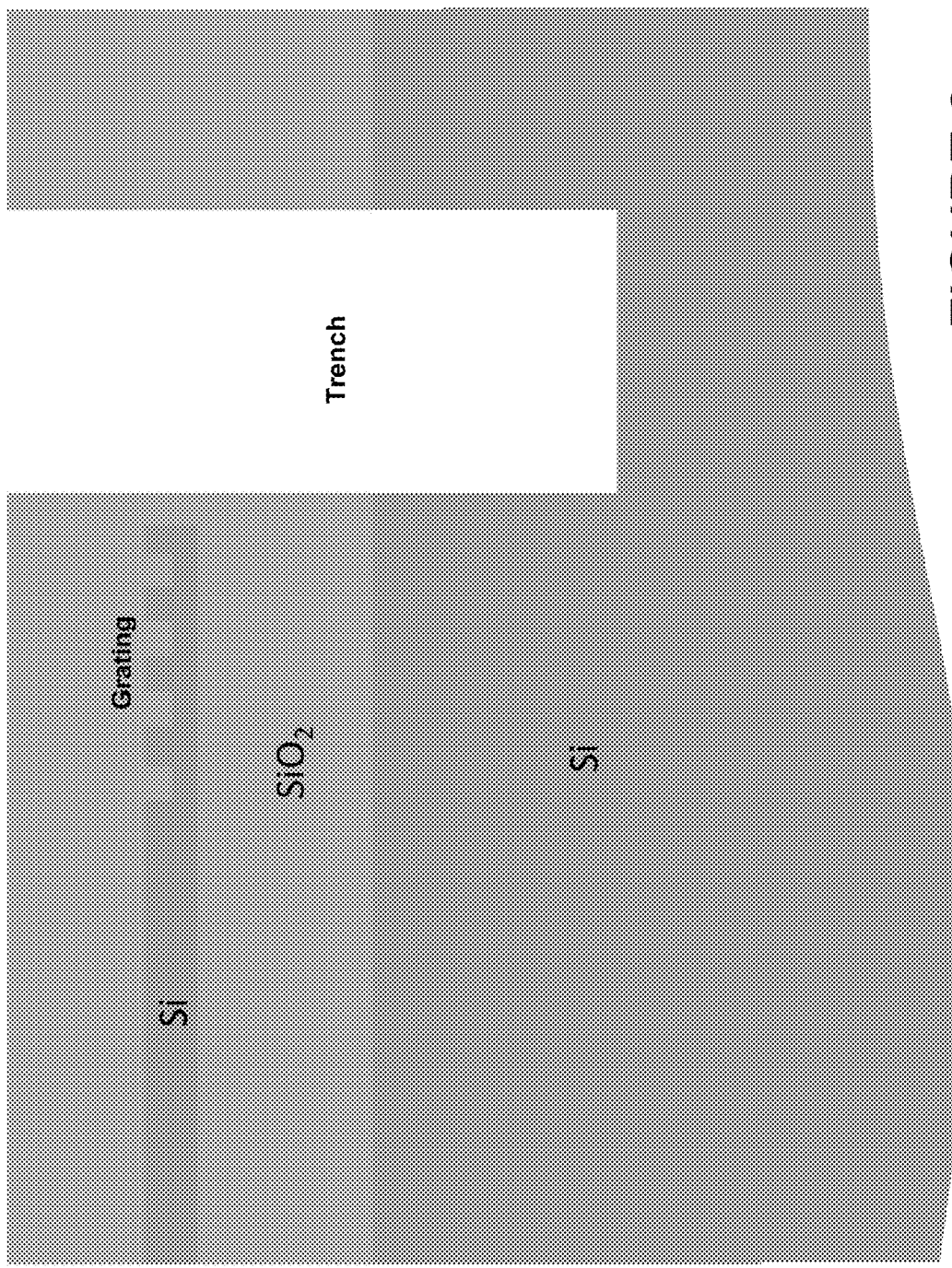
FIG. 2 shows a schematic side view of a trench etched adjacent to the grating coupler according to an according to an aspect of the present disclosure.

With reference now to FIG. 2, there it shows a trench etched adjacent to the grating coupler. The trench is etched such that it goes through the oxide and ~100 μm into the silicon substrate. Such etching may be performed by, for example, known processes including the Bosch process in an ICP etcher.

Figure 3:
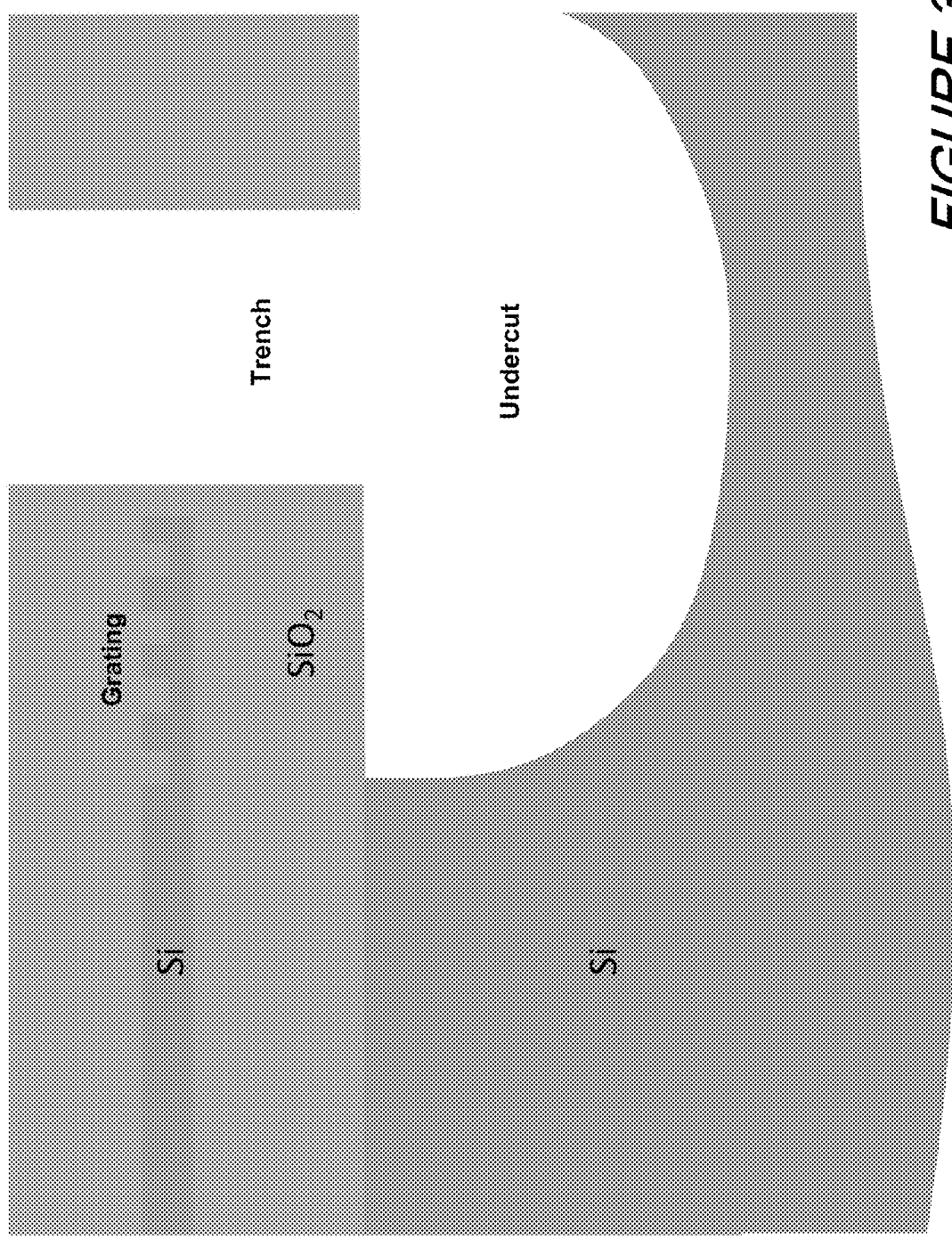
FIG. 3 shows a schematic side view of an isotropic silicon etch applied according to an aspect of the present disclosure.

Continuing with FIG. 3, an isotropic silicon etch is applied, such as in a plasma etcher which etches the Si isotropically, as shown in FIG. 3. As shown in FIG. 3, the silicon is undercut beneath the grating, relative to the top surface. As may be appreciated, such undercutting is oftentimes performed on waveguide structures to create a suspended waveguide for low-power thermooptic phase shifters.

Figure 4:
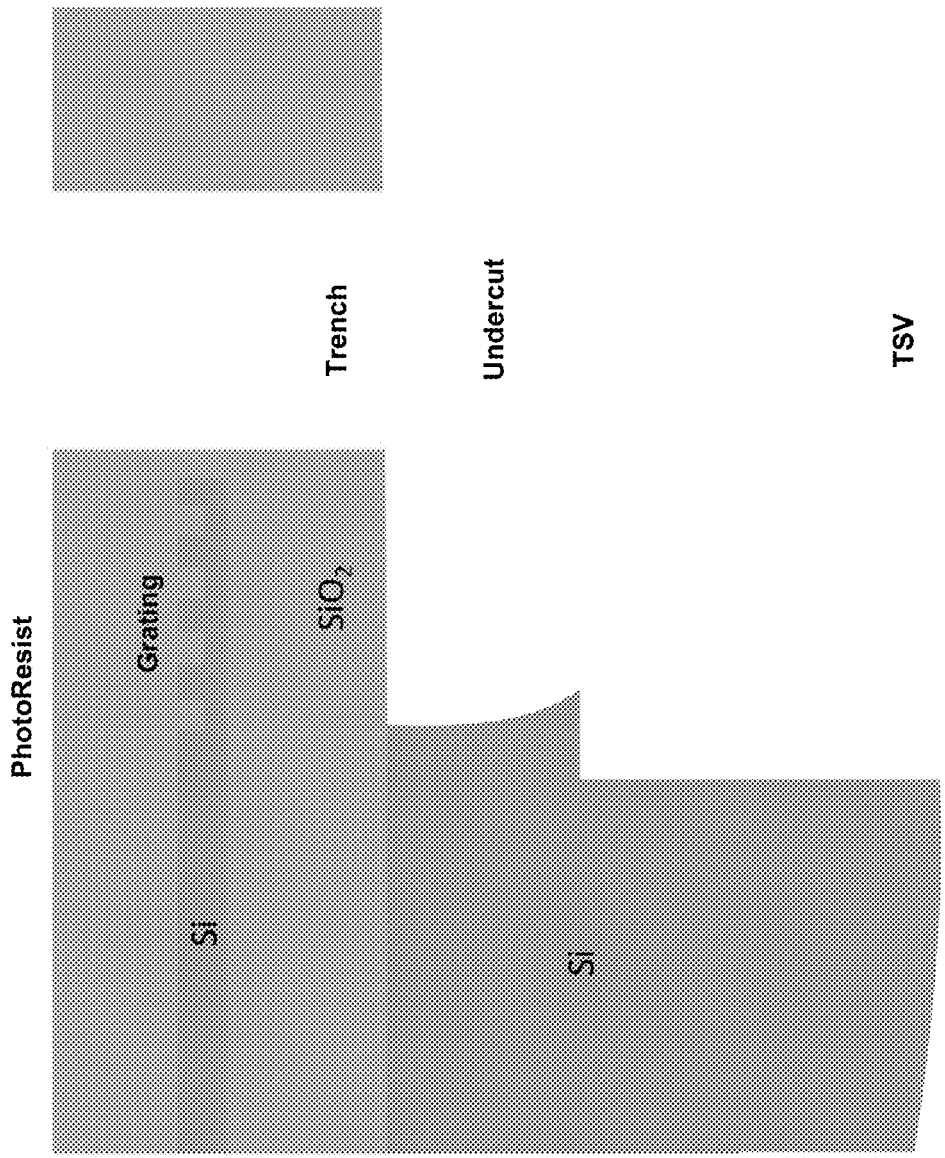
FIG. 4 shows a schematic side view of a through-silicon-vias (TSVs) etched from the backside according an aspect of the present disclosure.

Turning now to FIG. 4, the top of the structure/wafer. The wafer is flipped upside down and through-silicon-vias (TSVs) are etched from the backside such that the bottom of the oxide underlying the waveguide grating is exposed. The TSVs are etched until they reach the hollowed-out undercut silicon regions that were etched previously from the top side as depicted in FIG. 3. If front-back alignment is of concern, then TSVs from the front side could be etched first in unused parts of the overall waver. Similarly, if damage to the oxide from the TSV etch is a concern, then the TSV can be stopped slightly before "breakthrough" into the undercut, and final etch may be performed by a gentle plasma or silicon etch.

Figure 5:
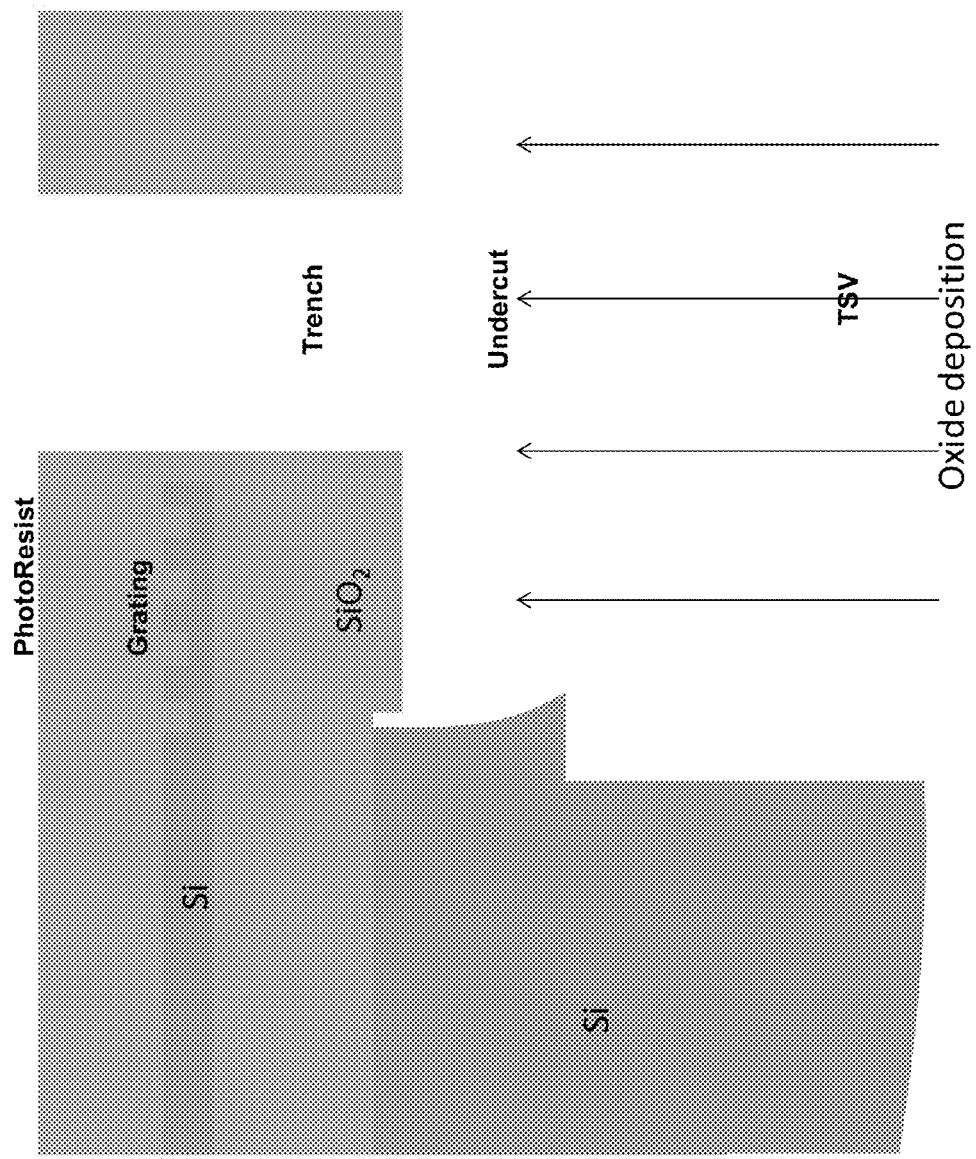
FIG. 5 shows a schematic side view of oxide deposition from backside according to an aspect of the present disclosure.

Once the oxide is exposed from the underside as a result of the etching, it is now possible to deposit a mirror or other reflective layer on the bottom of the exposed oxide. Alternatively, and as shown schematically in FIG. 5, an additional oxide thickness may be deposited before depositing the mirror thereby achieving a desirable thickness between the grating and the mirror.

Figure 6:
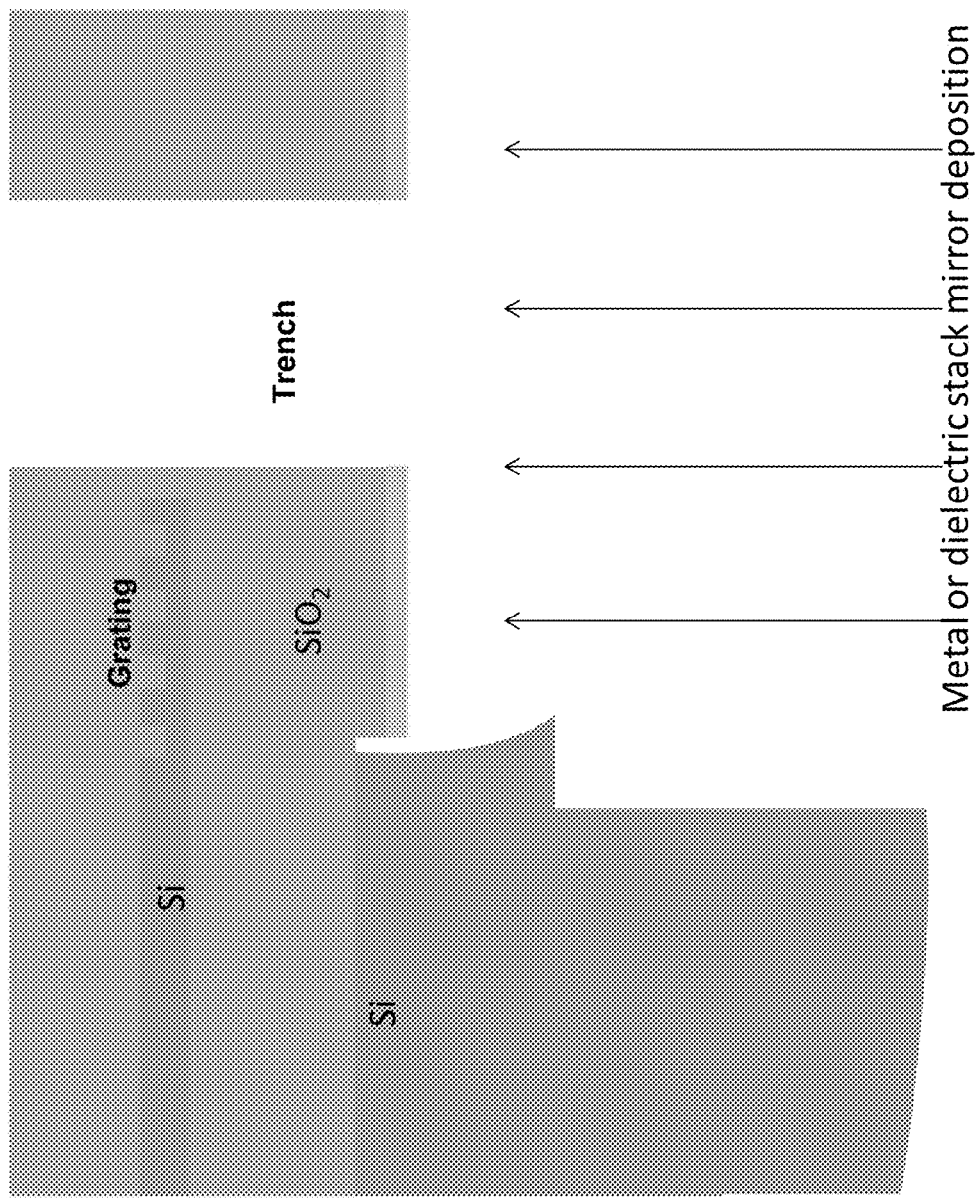
FIG. 6 shows a schematic side view of a mirror deposition from backside according to an aspect of the present disclosure.

The backside of the exposed oxide (either original or supplemental as in FIG. 5) is then coated with a metal, a dielectric mirror, or other mirror technology as shown schematically in FIG. 6. The exposed mirror, undercut, and TSV region(s) may then be backfilled with an appropriate material such as polymer, epoxy, or other.

As may be appreciated, with such structures according to the present disclosure the lower cladding oxide thickness (between the waveguide and the substrate) must be the proper thickness to provide constructive interference from the mirror reflection with the grating emission or reception. This thickness is set by the silicon-on-insulator (SOI) wafer, and is well within the tolerance of SOI wafer manufacturing. This thickness may be accurately verified with an ellipsometer before any wafer processing is performed.

Figure 7:
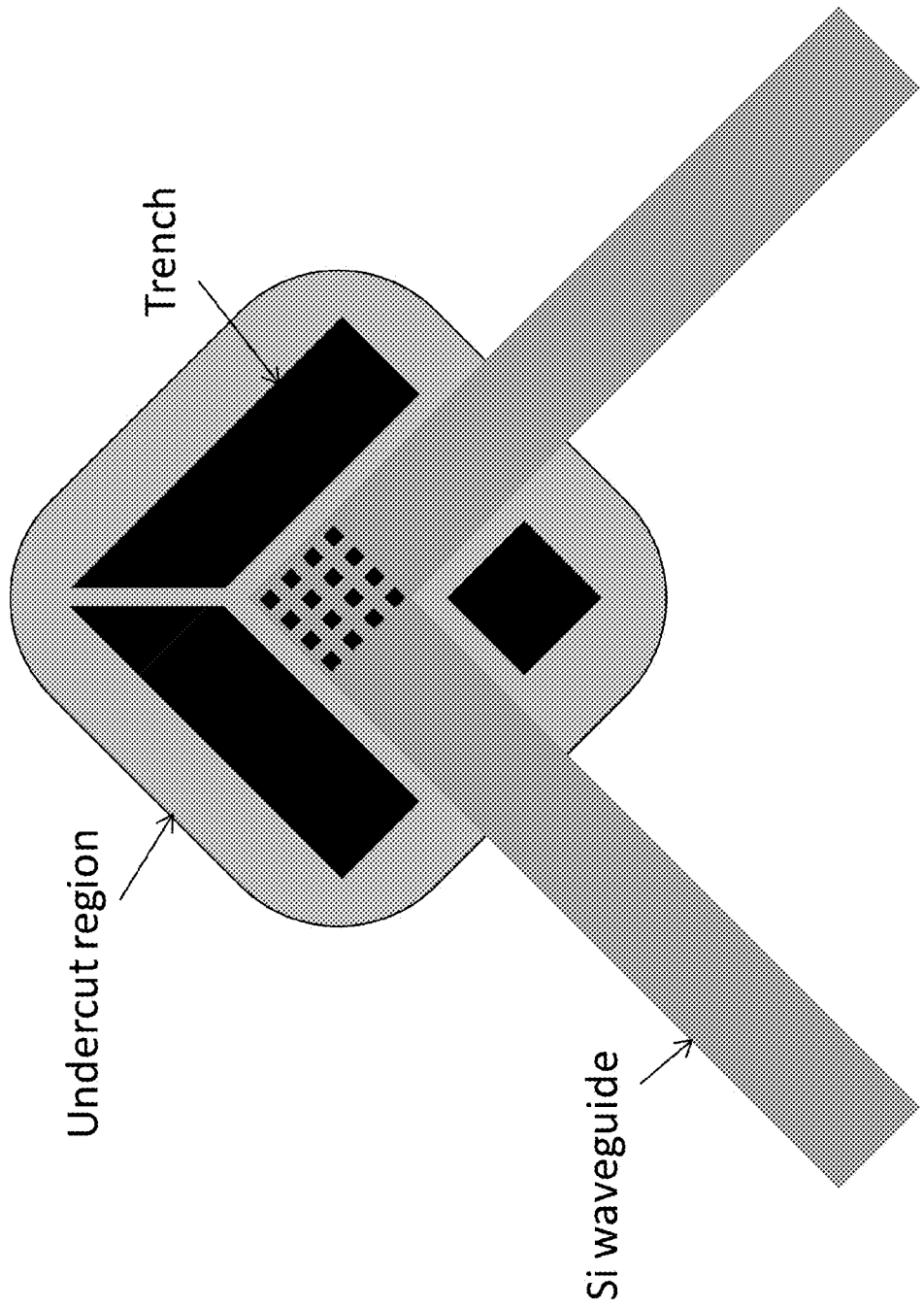
FIG. 7 shows a top view of an undercut 2D grating coupler showing waveguides, trenches and undercut region according to an aspect of the present disclosure.

Finally, and with reference now to FIG. 7, there is shown an exemplary top-view schematic of an undercut two-dimensional coupler according to an aspect of the present disclosure. As may be observed from this schematic top view, the trenches are arranged such that when the grating is fully undercut, bars or regions of oxide provide sufficient mechanical support to the grating.

While the methods according to the present disclosure have been described with respect to particular implementations and/or embodiments, those skilled in the art will recognize that the disclosure is not so limited. Accordingly, the scope of the disclosure should only be limited by the claims appended hereto.

The invention claimed is:

1. A method for preparing a low-loss, wide-band grating coupler comprising the steps of:

providing a optical grating disposed upon a top-surface of a substrate, wherein said optical grating including an overlying and underlying oxide cladding;

etching into the top surface of the substrate one or more trenches adjacent to the optical grating such that the trench extends into the substrate;

etching, by way of the one or more trenches, an undercut region beneath the optical grating in the substrate;

etching a via through a bottom surface of the substrate into the undercut region such that the underlying oxide cladding is exposed and accessible from the via; and depositing a mirror onto the exposed underlying cladding.

2. The method according to claim 1 further comprising the step of depositing additional oxide to the underlying cladding such that a desired overall, underlying oxide thickness is achieved.

3. The method according to claim 2 wherein said mirror is one selected from the group consisting of: metal, or dielectric stack.

4. A method for preparing a low-loss, wide-band grating coupler comprising the steps of:

providing a optical grating disposed upon a substrate, wherein said optical grating including an overlying and underlying oxide cladding;

etching one or more trenches adjacent to the optical grating such that the trench extends into the substrate;

wet etching the one or more trenches such that an undercut region is etched beneath the optical grating in the substrate;

etching a via through a bottom of the substrate into the undercut region such that the underlying oxide cladding is exposed and accessible from the via; and depositing a mirror onto the exposed underlying cladding.

5. The method according to claim 4 further comprising the step of depositing additional oxide to the underlying cladding such that a desired overall, underlying oxide thickness is achieved.

6. The method according to claim 5 wherein said mirror is one selected from the group consisting of: metal, or dielectric stack.

* * * * *